United States Patent [19]

Hermle

[11] 4,419,646

[45] Dec. 6, 1983

[54] ELECTRIC PROXIMITY SENSOR

[76] Inventor: Eduard Hermle, Kirchstrasse 20, D-7303 Neuhausen a.d.Fildern, Fed. Rep. of Germany

[21] Appl. No.: 425,013

[22] Filed: Sep. 27, 1982

Related U.S. Application Data

[63] Continuation of Ser. No. 212,757, Dec. 4, 1980, abandoned.

[30] Foreign Application Priority Data

Dec. 22, 1979 [DE] Fed. Rep. of Germany ....... 2951968

[51] Int. Cl.$^3$ .............................................. H01F 27/02
[52] U.S. Cl. ..................................... 336/90; 361/142; 361/380; 361/395; 335/205; 307/116
[58] Field of Search .................... 336/DIG. 2, 90, 92, 336/94, 96; 307/116, 117; 338/162-164, 32 R, 32 H; 340/693; 335/205; 361/142, 179-181, 331, 334, 380, 395, 399; 174/52 R, 52 PE, 52 S, 50

[56] References Cited

U.S. PATENT DOCUMENTS 3,502,948  3/1970  Crouch .............................. 174/52 S
4,049,986  9/1977  Kreuz .................................. 335/205

FOREIGN PATENT DOCUMENTS 473508  10/1937  United Kingdom ................ 338/164
571458  8/1945  United Kingdom ................ 338/164

*Primary Examiner*—G. P. Tolin
*Attorney, Agent, or Firm*—Stephenson & Boller

[57] ABSTRACT

An electric proximity switch of the type that is inserted into the cylinder wall of a hydraulic cylinder and is sealed tight with respect to the hydraulic fluid, the proximity sensor having a pick-up coil (24), a pot core (32) adapted to receive the pick-up coil, a cup-shaped insert member (20) within which the pick-up coil and pot core are confined, and a closure disc (34) that is separate of the insert member and is positively retained in sealed relation over the insert member and its contents by securing means (10d) in the casing sleeve (10) of the proximity sensor.

11 Claims, 1 Drawing Figure

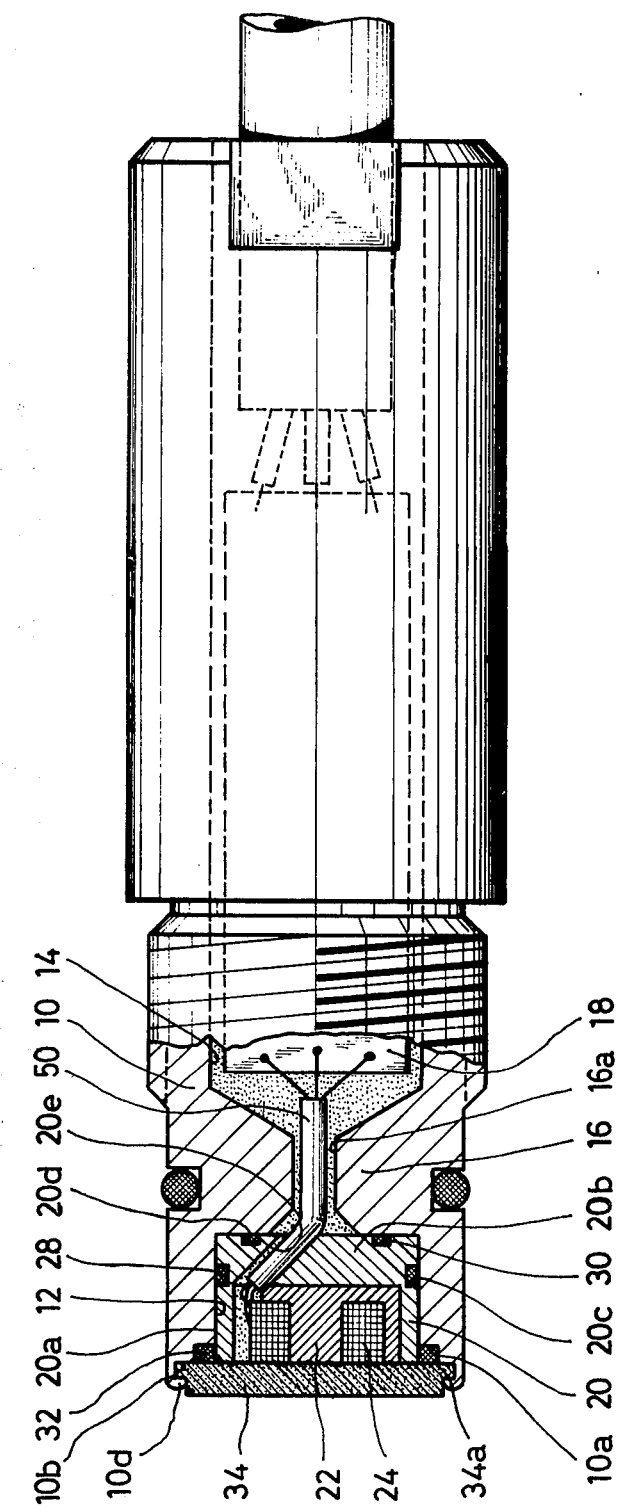

ELECTRIC PROXIMITY SENSOR

This application is a continuation of application Ser. No. 212,757 filed Dec. 4, 1980 now abandoned.

BACKGROUND AND SUMMARY OF THE INVENTION

The invention relates to an electric proximity sensor, which is sealed tight with respect to pressure fluid.

The preferred embodiment disclosed herein has a casing sleeve, one end of which is closed by a closing member of electrically insulating material, behind which there is disposed a search coil and a pot core adapted to receive the same and said pot core is surrounded by a circumferential wall of the insert member which bears on an internal shoulder, a bulkhead or the like of the casing sleeve disposed at an axial distance from the front end of the casing sleeve, which is closed by the closing member, with two O-rings, which are disposed in recesses in serial configuration at an axial distance from each other between the circumferential wall of the insert member and the casing sleeve.

An electric proximity sensor of this kind is already available on the market. These switches are normally used for detecting the limiting positions of pistons in hydraulic units and to this end are inserted into the cylinder wall of the appropriate hydraulic cylinder. The proximity sensors must therefore be sealed tight with respect to hydraulic fluid over rather wide and extreme temperature ranges (for example between −30° C. and +100° C.) a feature which cannot simply be achieved by pouring casting resin into the conventional casing sleeves which are adapted to receive the search coil with pot core as well as parts of the electrical circuit, because adhesion of the casting resin on metals is not particularly good and temperature expansion coefficients of metal and casting resins are too difficult to preclude detachment from the casing, quite apart from the shrinkage of casting resin which appears during polymerization. A fundamental remedy is also not possible even with the recently used quartz meal-loaded casting resins although these shrink or expand far less in the presence of temperature fluctuations than unloaded casting resins; however, in this case, the bond to the metallic casing sleeve is not improved and furthermore the bond between the casting resin and the quartz meal particles is loosened in the presence of temperature fluctuations and hydraulic fluid under pressure penetrates even into the smallest interface gaps.

In the known proximity sensor of the kind described hereinbefore, a cup-shaped plastics component forms the front closing member as well as the insert member and the pot core, adapted to receive the search coil, is retained by a casting resin fill against the inside of the aforementioned plastics member. This known proximity sensor suffers from two important disadvantages: on the one hand, the cup-shaped plastics closure member and insert is retained in the casing sleeve only by casting resin which penetrates from the rear to the inner O-ring and this is insufficient because of inadequate adhesion of the casting resin on the metallic casing sleeve. On the other hand, the casting resin fill, which supports the fracture-sensitive ferritic pot core must be introduced into the space behind the pot core through a port in a bulkhead which supports the plastics closure member and insert and is disposed in the casing sleeve and for this reason complete filling of the space behind the pot core and therefore the means for providing uniform mechanical support for the said pot core cannot be ensured. This reason alone is sufficient to lead to the risk of fracture of the pot core if the proximity sensor is stressed with hydraulic fluid. Since the ferritic material of the pot core has a much lower temperature expansion coefficient than casting resin which is loaded with quartz meal, it follows that the means for providing mechanical support for the pot core by means of the casting resin fill is even less satisfactory at low temperatures. Finally, there is a risk with the known proximity sensor of damage to the O-rings during assembly of the sensor: This is because the O-rings must be oversized in order to provide a seal in the axial direction between the casing sleeve and the plastics closure member and insert; when the said plastics member is inserted into the casing sleeve, the O-rings are twisted and squeezed so that after installation they are frequently severely damaged and cannot ensure proper sealing.

It was therefore the object of the invention to develop an electric proximity sensor, resistant to pressure fluid, in which the different temperature expansion coefficients of casting resin and other materials used, such as metal and ferrite, as well as the slight adhesion of the casting resin to metal do not have the detrimental consequences as in the previously described proximity sensor. Proceeding from a sensor of the kind described hereinbefore, this problem is solved in accordance with the invention in that the closing member is constructed as a component which is separate of the insert and is positively retained by securing means which are provided on the casing sleeve and is thrust in the axial direction against the outer O-ring, that the insert is provided with a bottom and is constructed substantially in cup-shape and that the space between the closing member and the bottom of the insert is filled, at least almost completely, by the pot core with search coil. In the construction according to the invention, the pot core therefore does not bear via a casting resin fill on an internal shoulder, bulkhead or the like of the casing sleeve but via the bottom of the cup-shaped insert, furthermore, the outer O-ring need not be forced when the sensor is assembled because it performs its sealing function by virtue of axial thrust applied to it by the closing member and finally, closing member, insert, pot core and search coil are positively retained in the casing sleeve. While the casting resin in the known proximity sensor must provide mechanical support, retention, sealing action, electrical insulation and possibly must also dissipate heat, most of these functions in the proximity sensor according to the invention are performed by metal parts and hydraulic seals (O-rings) while the casting resin only has a very slight stabilizing action and merely fills the small interstices between the coil windings and other gaps between the closing member, search coil, pot core, insert and casing sleeve.

Securing means provided on the casing sleeve can comprise a union nut. In a preferred embodiment of the proximity sensor according to the invention one end of the casing sleeve is flanged on to the closing member and it is advisable to provide the casing sleeve at this end with an internal shoulder on which the closing member bears. A closing member in the form of a disc represents the simplest solution but conveniently the edge zone on the outside of such a disc should have a step for the flange so that the disc cannot bulge during the flanging operation. Flanging simultaneously retains the closing member positively and therefore reliably and applies axial thrust onto the outer O-ring so that this bears sealingly all round with reliability.

The pot core must be electrically insulated with respect to the metallic casing sleeve. In known proximity switches this function was performed by the casing resin in which the pot core quasi-floats. The insert of a preferred embodiment of the proximity sensor according to the invention comprises a dural alloy and the surface thereof is hard anodized so that the hard anodized film functions as an insulating film. Another advantage of this construction is due to the fact that the pot core is supported by a metallic component, namely in the insert of duralumin and is thus reliably protected against mechanical overloading.

Finally, it is advisable for the end face of the assembly comprising the pot core and the search coil, which said assembly is nearest to the closing member, to be covered with a stratum of casting resin which is flush with the end face of the insert. In this way, a plane support surface is obtained for the closing member to ensure that the pot core is always uniformly stressed by the hydraulic pressure and cannot be stressed in bending, a feature which is of great significance in view of the fracture-sensitivity of the ferritic material of the pot core.

BRIEF DESCRIPTION OF THE DRAWING

Other features, details and advantages of the invention are disclosed in the accompanying claims and/or in the description hereinbelow and the accompanying drawing of one preferred embodiment of the proximity sensor according to the invention; the drawing shows such a proximity sensor as a side view and partially as a longitudinal section.

DESCRIPTION OF THE PREFERRED EMBODIMENT

The preferred proximity sensor comprises a casing sleeve 10, the interior of which is subdivided by a bulkhead 16 into a front and into a rear casing chamber 12 and 14 respectively. The latter accommodates a circuit board 18 with part of the electronic system of the proximity sensor, while the front casing chamber 12 contains a cup-shaped insert 20, a pot core 22 and a search coil 24.

The insert 20 consists of a duralumin alloy, has a circumferential region 20a and a bottom 20b and is provided at the circumference and at the bottom with annular grooves 20c, 20d for receiving O-rings 28 and 30.

The pot core 22 and the search coil 24 are of conventional construction but are so dimensioned that the outwardly facing end faces are not precisely flush with the outer end face of the insert 20 but recede slightly, the purpose of this prodecure will be explained subsequently.

The casing sleeve 10 is provided with a first and a second internal shoulder 10a and 10b and the first of these is adapted to receive an O-ring 32 and the outer internal shoulder is provided to support a closure disc 34 the outer edge zone of which is provided with a step 34a into which the front end region 10d of the casing sleeve 10 was flanged. Various dimensions were selected so that flanging not only urges the closure disc 34 against the internal shoulder 10b of the casing sleeve 10 but also exerts pressure in the axial direction on the O-rings 32 and 30 so that no radial oversize of the O-ring 32 is needed to ensure that it is reliably and sealingly pressed against the casing sleeve 10, the insert 20 and the closure disc 34; moreover, the axial thrust applied by the closure disc 34 on the insert 20 ensures deformation of the O-ring 30, such that the latter reliably seals the gap between the bottom 20b of the insert member 20 and the support surface of the bulkhead 16, a feature representing an additional advantage of the construction according to the invention.

The closure disc 34 can be constructed of any suitable electrically insulating material, for example plastics, glass, a dense ceramic material etc.

To ensure that the pot core 22 is electrically insulated with respect to the metallic casing 10, the insert 20, consisting of a duralumin alloy, was hard anodized because such a hard anodized film has adequate insulating properties.

The search coil 24 is electrically connected by means of a conductor 50 which is extended from the circuit board 18 through a port 16a in the bulkhead 16 of the casing sleeve and a port 20e in the insert 20 and terminates in a slit which is associated with the pot core 22 and extends as far as the search coil 24.

The following procedure is adopted for assembling the switch according to the invention:

First, the search coil 24 and the pot core 22 are inserted into the cup-shaped insert 20 whereupon the interstices of the coil winding as well as the small joints between the insert 20, pot core 22 and search coil 24 are filled with a casting resin. This also forms a thin film over the front end faces of the search coil 24 and of the pot core 22 and the external surface of said film is flush with the front end face of the insert 20. This provides a flat support for the closure disc 34. After the search coil 24 is connected by means of the conductor 50 to the circuit board 18, the rear housing chamber 14, the port 16a in the bulkhead 16 and the joint between the inserts 20 and the casing sleeve 10 are filled as far as the rear O-ring 30, or no further than the O-ring 28, with casting resin which cannot advance to the front O-ring 32 by virute of the presence of the aforementioned two O-rings, so that the O-ring 32 always remains resilient and can reliably seal against hydraulic fluid which penetrates from the front.

What is claimed is:

1. An electric proximity sensor of the type which in use is exposed to pressure fluid and which comprises a casing having an interior chamber space open at one axial end and bounded circumferentially by a sidewall and at the opposite axial end by a transverse wall, a pick-up coil and pot core unit disposed within said interior space, a closure closing said one axial end and an O-ring seal circumferentially sealing between said closure and said sidewall, characterized in that a separate insert member is provided between said unit and said walls bounding said interior space, said insert member being dimensioned to fit closely with respect to said walls and comprising a cavity which is open toward said one axial end, said cavity being dimensioned to receive said unit with a close fit, said insert and said unit substantially filling said interior space, said sensor further comprising means defining a shoulder which extends circumferentially around the inside perimeter of said sidewall at said one axial end of said casing, said closure having a circumferential margin which is disposed to radially overlap said shoulder, said O-ring seal being disposed on said shoulder, and means for retaining said closure on said casing such that said O-ring seal is axially compressed against said shoulder by the circumferential margin of said closure and forms a circumferential seal between said closure and said casing.

2. An electric proximity sensor as set forth in claim 1 further characterized in that said insert is an insulated metal element.

3. An electric proximity sensor as set forth in claim 2 further characterized in that said insulated metal element comprises a dural alloy and its surface is hard anodized.

4. An electric proximity sensor as set forth in claim 1 further characterized in that an additional O-ring seal is disposed between said insert member and said transverse wall and is axially compressed therebetween, said transverse wall comprising an opening therethrough which is bounded by said additional O-ring seal and through which a cable from the pick-up coil passes.

5. An electric proximity sensor as set forth in claim 1 further characterized in that a further O-ring seal is provided between said insert member and said sidewall, said further O-ring seal being disposed axially between the first mentioned O-ring seal and said transverse wall.

6. An electric proximity sensor as set forth in claim 1 further characterized in that a thin layer of casting resin is disposed over said pick-up coil and pot core unit between it and said closure.

7. An electric proximity sensor as set forth in claim 1 further characterized by said shoulder being provided in said casing.

8. An electric proximity sensor as set forth in claim 1 characterized in that one end of said casing is flanged onto said closure.

9. An electric proximity sensor as set forth in claim 1 characterized in that said closure has the shape of a disc.

10. An electric proximity sensor as set forth in claim 8 characterized in that the external edge zone of said closure is provided with a step for the flange.

11. An electric proximity sensor as set forth in claim 4 characterized in that a casting resin fill is provided in said casing interior of said additional O-ring seal.

* * * * *